United States Patent
Vasyltsov et al.

(10) Patent No.: US 11,232,038 B2
(45) Date of Patent: Jan. 25, 2022

(54) TERNARY CONTENT ADDRESSABLE MEMORY AND OPERATING METHOD THEREOF

(71) Applicant: Samsung Electronics Co., Ltd., Suwon-si (KR)

(72) Inventors: Ihor Vasyltsov, Yongin-si (KR); Youngnam Hwang, Hwaseong-si (KR); Yongha Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 52 days.

(21) Appl. No.: 16/890,169

(22) Filed: Jun. 2, 2020

(65) Prior Publication Data

US 2020/0387452 A1 Dec. 10, 2020

(30) Foreign Application Priority Data

Jun. 5, 2019 (KR) .................. 10-2019-0066885
Aug. 12, 2019 (KR) .................. 10-2019-0098347

(51) Int. Cl.
G06F 12/0875 (2016.01)
G11C 15/00 (2006.01)
G06N 20/00 (2019.01)

(52) U.S. Cl.
CPC ......... *G06F 12/0875* (2013.01); *G06N 20/00* (2019.01); *G11C 15/00* (2013.01); *G06F 2212/45* (2013.01)

(58) Field of Classification Search
CPC . G06F 12/0875; G06F 2212/45; G06N 20/00; G11C 15/00
See application file for complete search history.

(56) References Cited

U.S. PATENT DOCUMENTS

| | | |
|---|---|---|
| 6,125,441 A | 9/2000 | Green |
| 6,230,237 B1 | 5/2001 | Tao et al. |
| 7,761,774 B2 | 7/2010 | Fischer et al. |
| 7,765,174 B2 | 7/2010 | Pham |
| 7,856,523 B2 | 12/2010 | Bittner, Jr. |
| 8,352,677 B2 | 1/2013 | Sasao |
| 9,563,599 B2 | 2/2017 | Follett et al. |
| 10,062,377 B2 | 8/2018 | Larri et al. |
| 2014/0219279 A1 | 8/2014 | Gross et al. |

(Continued)

OTHER PUBLICATIONS

Tian, Ye, et al. "Lookup table allocation for approximate computing with memory under quality constraints." 2018 Design, Automation & Test in Europe Conference & Exhibition. IEEE, 2018. (Year: 2018).*

(Continued)

*Primary Examiner* — Charles Rones
*Assistant Examiner* — Hewy H Li
(74) *Attorney, Agent, or Firm* — Harness, Dickey & Pierce, P.L.C.

(57) ABSTRACT

A ternary content addressable memory device (TCAM) may include: a cache memory storing a look-up table with respect to a calculation result of a plurality of functions; an approximation unit configured to generate mask bits; and a controller configured to obtain an approximation input value corresponding to an input key based on the mask bits and to retrieve an output value corresponding to the obtained approximation input value from the look-up table.

19 Claims, 18 Drawing Sheets

(56) References Cited

U.S. PATENT DOCUMENTS

| | | |
|---|---|---|
| 2017/0103311 A1 | 4/2017 | Henry et al. |
| 2018/0018257 A1 | 1/2018 | Miki |
| 2018/0165381 A1 | 6/2018 | Venkatesh et al. |
| 2020/0201601 A1* | 6/2020 | Mangnall ................ G06F 7/544 |

OTHER PUBLICATIONS

Razlighi, Mohammad Samragh, et al. "LookNN: Neural network with no multiplication." Design, Automation & Test in Europe Conference & Exhibition, 2017. IEEE, 2017. (Year: 2017).*

Imani, Mohsen, Abbas Rahimi, and Tajana S. Rosing. "Resistive configurable associative memory for approximate computing." 2016 Design, Automation & Test in Europe Conference & Exhibition. IEEE, 2016. (Year: 2016).*

Imani, Mohsen, et al. "Efficient neural network acceleration on gpgpu using content addressable memory." Design, Automation & Test in Europe Conference & Exhibition, 2017. IEEE, 2017. (Year: 2017).*

Tian, Ye, et al. "ApproxLUT: A novel approximate lookup table-based accelerator." 2017 IEEE/ACM International Conference on Computer-Aided Design (ICCAD). IEEE, 2017. (Year: 2017).*

Chang, Yen-Jen, Kun-Lin Tsai, and Hsiang-Jen Tsai. "Low leakage TCAM for IP lookup using two-side self-gating." IEEE Transactions on Circuits and Systems I: Regular Papers 60.6 (2013): 1478-1486. (Year: 2013).*

\* cited by examiner

| MSB/LSB | HD[1] | HD[0] | MASK[3:0] |
|---|---|---|---|
| 0 | 0 | 0 | 1 1 1 1 |
| 0 | 0 | 1 | 1 1 1 0 |
| 0 | 1 | 0 | 1 1 0 0 |
| 0 | 1 | 1 | 1 1 0 0 |
| 1 | 0 | 0 | 1 1 1 1 |
| 1 | 0 | 1 | 0 1 1 1 |
| 1 | 1 | 0 | 0 0 1 1 |
| 1 | 1 | 1 | 0 0 1 1 |

FIG. 5A

| a | b | c | | | a*b+c |
|---|---|---|---|---|---|
| 16 | 16 | 8 | 4 | 4 | 32/16 |
|  |  | MSB |  | LSB |  |

2HD
1HD
allowable misses

FIG. 5B

| a | | | b | | | a+b |
|---|---|---|---|---|---|---|
| 8 | 4 | 4 | 8 | 4 | 4 | 17/16 |
| MSB | | LSB | MSB | | LSB | |

2HD, 1HD allowable misses (for a and b)

FIG. 5C

| a | | | SIGM( ) | SIGM(a) |
|---|---|---|---|---|
| 4 | 4 | 8 | | |
| MSB | | LSB | | |

2HD
1HD
allowable misses

TERNARY CONTENT ADDRESSABLE MEMORY AND OPERATING METHOD THEREOF

CROSS-REFERENCE TO RELATED APPLICATIONS

This application claims the benefit of Korean Patent Application Nos. 10-2019-0066885 and 10-2019-0098347, filed on Jun. 5 and Aug. 12, 2019, respectively, in the Korean Intellectual Property Office, the disclosures of which are each incorporated herein in their entireties by reference.

BACKGROUND

The inventive concepts relate to a content addressable memory (CAM). For example, at least some example embodiments relate to a ternary CAM that performs approximation computing for machine learning and deep learning and/or an operating method thereof.

The CAM may search for a data word that matches a search word (search data) among stored data words (for example, entries), and when there is the matching data word, may output an address of the matching data word.

CAMs may be classified into binary CAMs and ternary CAMs. Each memory cell of a binary CAM may store information of either "0" or "1". Each memory cell of a ternary CAM (TCAM) may store information of "X" (don't care) in addition to "0" and "1". The "X" may have any value of "0" or "1".

An electronic device including a TCAM may efficiently perform a process of processing a plurality of calculations in parallel in machine learning or deep learning. In order to process the plurality of calculations in machine learning and deep learning, the electronic device including the TCAM may include a dedicated accelerator for each function that requires processing, thereby improving a calculation processing speed.

SUMMARY

The inventive concepts provide a ternary content addressable memory device for increasing the calculation speed of a machine learning and deep learning process by performing approximation computing on an input key using mask bits with respect to preloaded data thereby reducing a number of misses with respect to the input key.

According to an example embodiment of the inventive concepts, there is provided a ternary content addressable memory device (TCAM) including: a cache memory configured to store a look-up table for a plurality of functions; and processing circuitry configured to, generate mask bits, obtain an approximation input value corresponding to an input key based on the mask bits, and retrieve an output value corresponding to the approximation input value from the look-up table.

According to another example embodiment of the inventive concepts, there is provided a method of operating a ternary content addressable memory device (TCAM), the method including: receiving information about an input key and a calculation function; generating mask bits based on accuracy information and bit selection information, the accuracy information including a value of a hamming distance and the bit selection information indicating one of a most significant bit (MSB) or a least significant bit (LSB); obtaining an approximation input value corresponding to the input key based on the mask bits; and retrieving an output value corresponding to the approximation input value from a look-up table.

According to another example embodiment of the inventive concepts, there is provided a ternary content addressable memory device (TCAM) including: processing circuitry configured to generate mask bits for approximation computing; and a look-up table configured to store calculation results with respect to a plurality of functions, wherein the approximation computing includes obtaining an approximation input value corresponding to an input key based on the mask bits, and retrieving an output value corresponding to the approximation input value from the look-up table.

BRIEF DESCRIPTION OF THE DRAWINGS

Example embodiments of the inventive concepts will be more clearly understood from the following detailed description taken in conjunction with the accompanying drawings in which:

FIGS. 5A to 5C illustrate examples of approximation computing for linear and nonlinear functions according to example embodiments of the inventive concepts;

DETAILED DESCRIPTION

Figure 1:
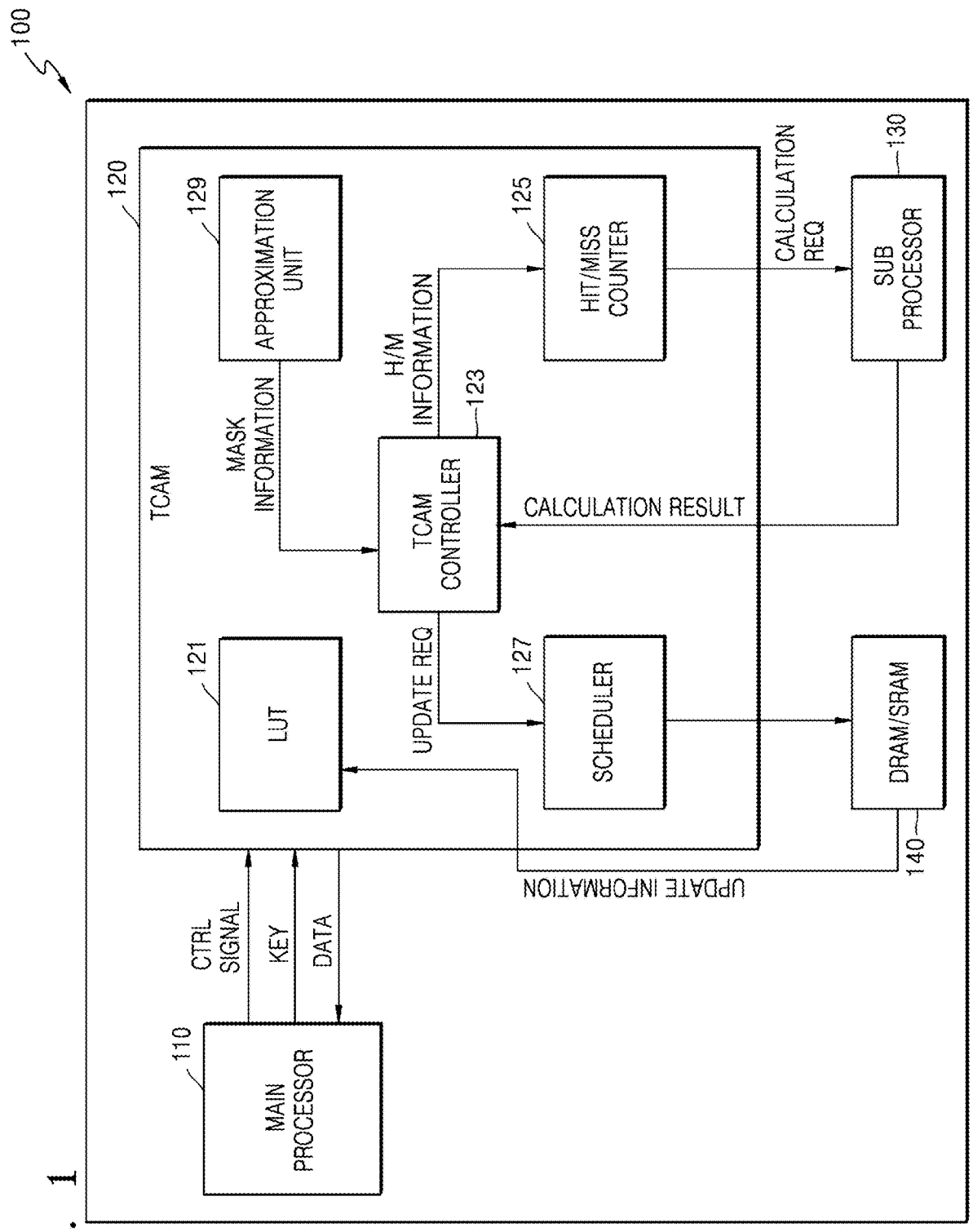
FIG. 1 is a block diagram of a device including a ternary content addressable memory according to example embodiments of the inventive concepts.

FIG. 1 is a block diagram of an electronic device 100 including a ternary content addressable memory according to example embodiments of the inventive concepts.

Referring to FIG. 1, the electronic device 100 may include a main processor 110, a ternary content addressable memory (hereinafter referred to as a TCAM) 120, a subprocessor 130, and random access memory 140.

According to various example embodiments, the main processor 110 may control the electronic device 100 generally. For example, the main processor 110 may execute software to control at least one other component (e.g., the TCAM 120) of the electronic device 100, connected to the main processor 110, and perform various data processing or calculations. For example, the main processor 110 may perform task processing or calculation for machine learning (ML) and/or deep learning (DL).

Such machine learning systems may utilize a variety of artificial neural network organizational and processing models, such as convolutional neural networks (CNN), deconvolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM). Alternatively or additionally, such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may also be used to provide various services and/or applications, e.g., an image classify service, a user authentication service based on bio-information or biometric data, an advanced driver assistance system (ADAS) service, a voice assistant service, an automatic speech recognition (ASR) service, or the like, may be performed, executed or processed by the electronic device 100.

According to various example embodiments, the main processor 110 may be distinguished from the subprocessor 130. For example, the main processor 110 may correspond to a central processing unit (CPU), and the subprocessor 130 may correspond to one of a graphic processing unit (GPU), a neural processing unit (NPU), or a micro processing unit (MPU).

The subprocessor 130 may receive a calculation request from the TCAM 120 and perform a requested calculation in response thereto. When data corresponding to an input key is not stored in the TCAM 120, the TCAM 120 may transmit the calculation request to the subprocessor 130 to perform a calculation according to the input key. In various example embodiments of the inventive concepts, the electronic device 100 may not include dedicated accelerators for processing each of a plurality of calculations, but instead may control the subprocessor 130 to perform the plurality of calculations.

The TCAM 120 can store a look-up table (hereinafter referred to as LUT) 121, and may include a TCAM controller (hereinafter referred to as a controller) 123, a hit/miss counter (hereinafter referred to as an H/M counter) 125, a scheduler 127, and an approximation unit 129.

The LUT 121 may correspond to a set of previously calculated results with respect to a specific calculation. The LUT 121 may be referenced to shorten a time for performing the specific calculation and to quickly obtain a resultant value. The set data of the previously calculated results stored in the LUT 121 may correspond to pre-loaded data. The specific calculation may include calculations required to perform an ML algorithm or a DL algorithm. For example, the specific calculation may include, but is not limited to, a multiply (MUL) calculation, a SIGMOID calculation, a hyperbolic tangent (TANH) calculation, and a square root (SQRT) calculation.

According to various example embodiments, since the LUT 121 stores the previously calculated resultant values, an operation time may be reduced compared to when a calculation is performed through the dedicated accelerator for each calculation. For example, when the dedicated accelerator performs the SIGMOID calculation, it may take 50 clocks, whereas according to various example embodiments of the inventive concepts, since the previously calculated resultant values are stored in the LUT 121, the SIGMOID calculation may be performed by requesting access from the LUT 121 and reading the previously calculated resultant values. In this case, the SIGMOID operation may be performed within one to two clocks.

The controller 123 may control the TCAM 120 generally. The controller 123 may control the TCAM 120 to perform data transmission/reception with an external component (e.g., the main processor 110) or to retrieve data corresponding to the input key. For example, the controller 123 may transmit hit or miss information about keys input to the H/M counter 125, transmit an update request signal to the scheduler 127, or receive mask information from the approximation unit 129.

The H/M counter 125 may receive the hit/miss information indicating a search result with respect to the input key from the controller 123. The H/M counter 125 may use the received information to count the number of hits with respect to the input key or the number of misses with respect to the input key and calculate a hit/miss ratio.

The scheduler 127 may receive the update request signal from the controller 123, and in response thereto, may request the random access memory 140 for data for updating the LUT 121. The random access memory 140 may store data with respect to an input key with a low number of calls in a distribution of input keys. The data for updating the LUT 121 may be stored in the LUT 121 when the number of requests by the input key in the data not stored in the LUT 121 exceeds a desired (or, alternatively, a predetermined) number such that the data may be included as pre-loaded data.

The approximation unit 129 may provide the mask information to the controller 123. The mask information relates to mask bits and may be used as a result of comparing a retrieved key with TCAM keys stored in the LUT 121. By performing an AND calculation on the result of comparing the retrieved key with each of the TCAM keys, a key bit of the same position as a bit "0" among the mask bits may be equivalent to "Don't care".

Figure 2:
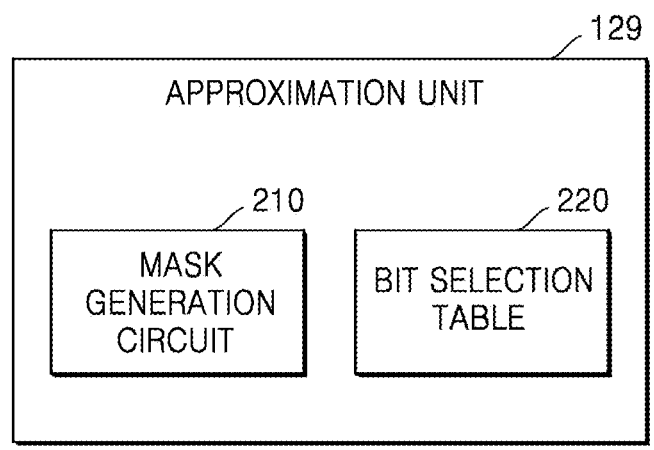
FIG. 2 is a subblock diagram of an approximation unit according to example embodiments of the inventive concepts.

FIG. 2 is a subblock diagram of the approximation unit 129 according to example embodiments of the inventive concepts.

The approximation unit 129 shown in FIG. 2 may correspond to the approximation unit 129 shown in FIG. 1.

According to various example embodiments, the approximation unit 129 may include a mask generation circuit 210 and a bit selection table 220.

The bit selection table 220 may include information for selecting one of the most significant bit (MSB) or the least significant bit (LSB). The information included in the bit selection table 220 may correspond to Table 1 below.

TABLE 1

| Calculation function | Bit selection information |
| --- | --- |
| SIGMOID | MSB |
| MULTIPLY | LSB |
| ADD | LSB |
| TANH | MSB |

Referring to Table 1 above, the bit selection table 220 may indicate any one of the MSB or the LSB corresponding to each calculation function. For example, when the calculation function is SIGMOID or TANH, a function output value saturates as the input value of the function increases. That is, when the input value of the function is more than a certain size, even if the input value changes, the output value may be maintained constant. Therefore, in the case of the SIGMOID function, the MSB may be set to "Don't care". As another example, when the calculation function is MULTIPLY or ADD, the resultant value of the MULTIPLY calculation or the ADD calculation has a large change in the output value when the MSB changes. That is, the effect of a change of the LSB on the output value may be relatively small compared to the effect of a change of the MSB on the output value. Therefore, when the calculation function is MULTIPLY, the LSB may be set to "Don't care".

According to various example embodiments, the bit selection table 220 may receive information about the calculation function from the main processor 110 or the controller 123, and provide bit selection information corresponding to the calculation function to the mask generation circuit 210.

The mask generation circuit 210 may generate mask bits. The mask generation circuit 210 may generate the mask bits based on the bit selection information received from the bit selection table 220 and accuracy information.

The accuracy information may be provided from the main processor 110 or the controller 123. The accuracy information may include information indicating how much approximation is to be performed in approximation computing. The accuracy information may include information about a hamming distance (hereinafter referred to as HD). The HD may correspond to the same position in two character strings having the same length but may indicate the number of characters having different values. For example, the HD between a "1100" bit string and a "1110" bit string may be "1". The HD between the "1100" bit string and a "1111" bit string may be "2". The HD between the "1111" bit string and the "1111" bit string may be 0. That is, the smaller the HD, the two character strings or bit strings to be compared may correspond to the same character string or bit string.

According to various example embodiments, the accuracy information may have a value of one of 0HD, 1HD, or 2HD. For example, when the accuracy information is 0HD, the TCAM 120 may not perform approximation computing and may output data only when an input key and a key stored in the TCAM 120 accurately match. As another example, when the accuracy information is 1HD, the TCAM 120 may perform approximation computing. The TCAM 120 may output data until one bit value is different between the input key and the key stored in the TCAM 120. A position of the one bit may be determined according to the bit selection information. As another example, when the accuracy information is 2HD, the TCAM 120 may output a value more approximate to that when the accuracy information is 1HD. That is, the TCAM 120 may output data until two bits differ between the input key and the key stored in the TCAM 120. Positions of the two bits may be determined according to the bit selection information.

Figure 3A:
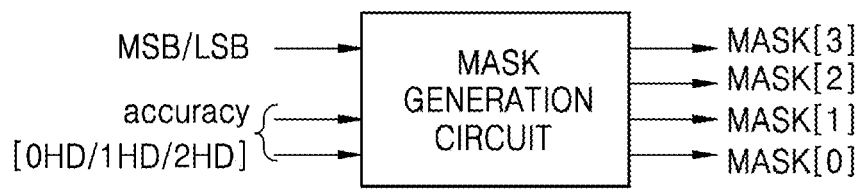
FIG. 3A illustrates an example of a mask generation circuit and mask bits according to example embodiments of the inventive concepts.
Figure 3B:
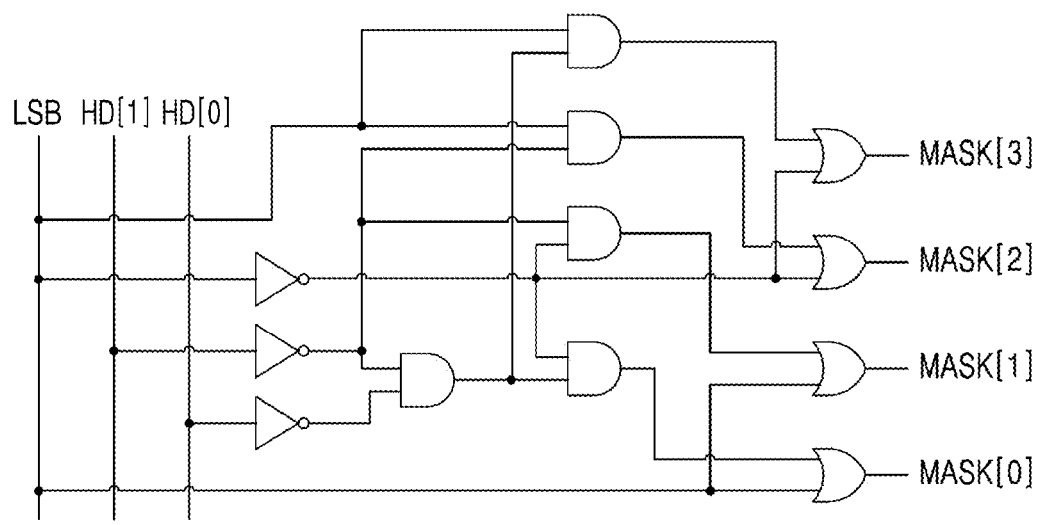
FIG. 3B is a circuit diagram of the mask generation circuit according to example embodiments of the inventive concepts.

FIG. 3A illustrates an example of the mask generation circuit 210 and mask bits according to example embodiments of the inventive concepts, and FIG. 3B is a circuit diagram of the mask generation circuit 210 according to example embodiments of the inventive concepts.

Referring to FIG. 3A, the mask generation circuit 210 is shown. The mask generation circuit 210 may receive bit selection information (e.g. information indicating MSB or LSB) of one bit and accuracy information (e.g., information indicating 0HD, 1HD, or 2HD) of two bits.

As described above, since the bit selection information is information indicating one of the MSB and the LSB, the bit selection information may be expressed in one bit. Hereinafter, the MSB is indicated when the bit selection information is "1" and the LSB is indicated when the bit selection information is "0". However, example embodiments are not limited thereto.

In addition, as described above, since the accuracy information is information indicating one of 0HD, 1HD, or 2HD, the accuracy information may be expressed by at least 2 bits. When a value of the accuracy information is "0", that is, HD[1:0]=00, the accuracy information may indicate 0HD and the TCAM 120 may not perform approximation computing. When the value of the accuracy information is "1", that is, HD[1:0]=01, the accuracy information may indicate 1HD and the TCAM 120 may output data of keys of which one bit is different from the input key among keys stored in the TCAM 120. When the value of the accuracy information is "2", that is, HD[1:0]=10, the accuracy information may indicate 2HD and the TCAM 120 may output data of keys of which two bits are different from the input key among keys stored in the TCAM 120. However, example embodiments are not limited thereto and the accuracy information may indicate the hamming distance in various manners.

According to various example embodiments, when generating the mask bits considering both the bit selection information and the accuracy information, the mask bits may correspond to a table shown in FIG. 3A. Referring to the table shown in FIG. 3 A, for example, when a calculation function is ADD or MULTIPLY, the bit selection information may be "0" to indicate the LSB since the effect of the LSB is small. When one bit error is allowed for approximation computing, since the accuracy information is 1HD, HD[1:0]=01. Accordingly, it may be seen that the generated mask bits are MASK[3:0]=1110. However, example embodiments are not limited thereto.

Referring to FIG. 3B, the circuit diagram corresponding to the table of FIG. 3A is shown. As in the above-described example embodiment, when the bit selection information is "0" and the accuracy information is "01" of 1HD, mask bits output from the four OR gates may correspond to "1110".

Figure 4A:
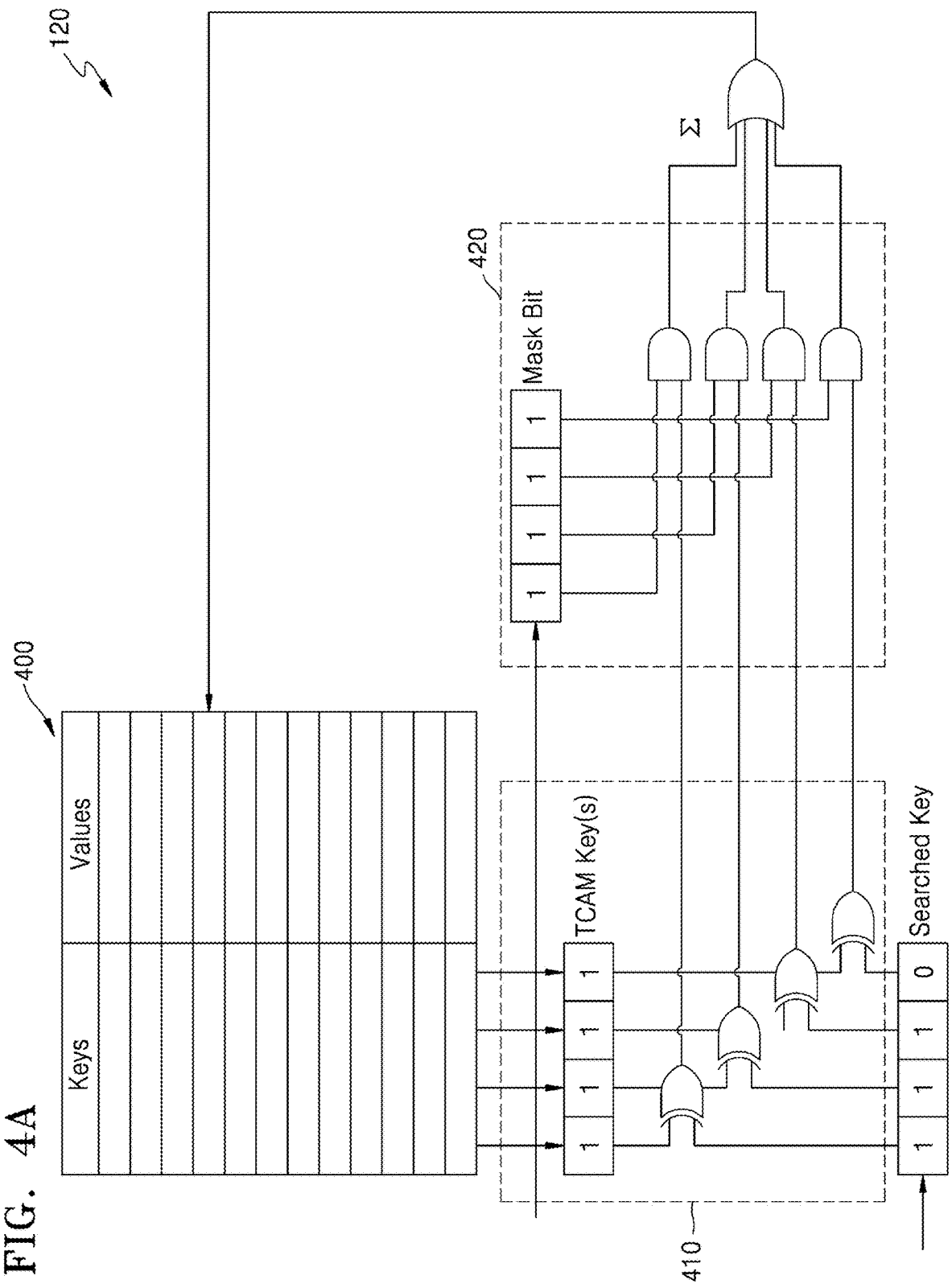
FIG. 4A is a circuit diagram for performing a comparison calculation in a ternary content addressable memory (TCAM) according to example embodiments of the inventive concepts.
Figure 4B:
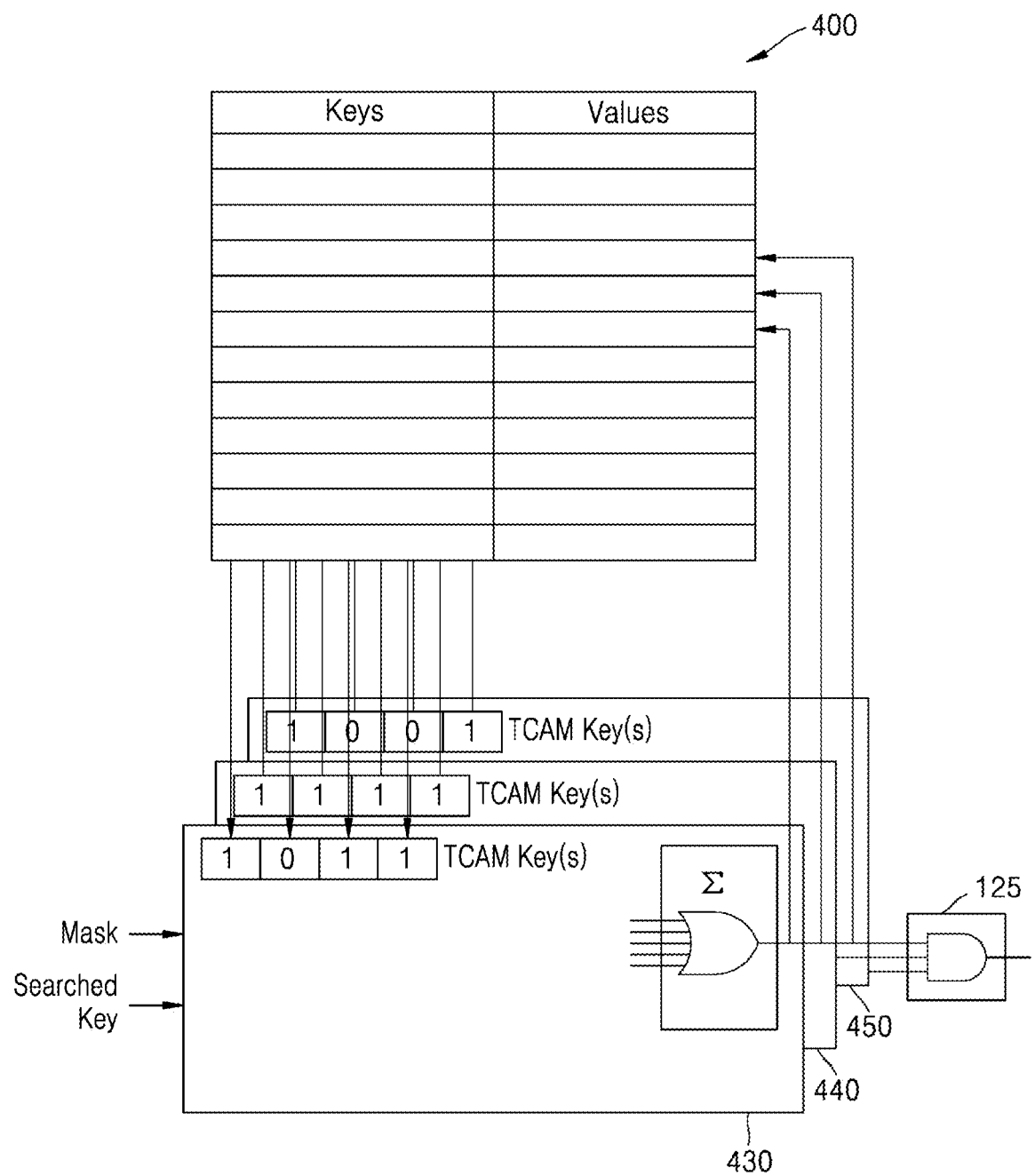
FIG. 4B illustrates an example of a circuit diagram for performing a comparison calculation in parallel.

FIG. 4A is a circuit diagram for performing a comparison calculation in the TCAM 120 according to example embodiments of the inventive concepts, and FIG. 4B illustrates an example of a circuit diagram for performing a comparison calculation in parallel.

Referring to FIG. 4A, the circuit diagram in which the TCAM 120 performs the comparison calculation to determine whether a value corresponding to an input key exists is shown. A key-value table 400 shown in FIG. 4A may be stored in at least a part of the LUT 121 shown in FIG. 1, or may be stored in a separate storage. According to various example embodiments, the key-value table 400 may be a table that maps a plurality of keys and output values corresponding to the plurality of keys, respectively.

The TCAM 120 may compare a key value searched through a comparator 410 with a key value received from the key-value table 400. The comparator 410 may include a plurality of XOR gates. The number of XOR gates may correspond to the number of bits of input keys or keys stored in the key-value table 400. For example, when the number of bits of the input keys or keys stored in the key-value table 400 is 4, the number of XOR gates included in the comparator 410 may be 4. Each of the plurality of XOR gates may output whether a bit string coincides between the input key and the key received from the key-value table 400. For example, when a bit string "1110" of the input key and a key string "1111" among the keys stored in the key-value table 400 are compared, since all other bit strings except the LSB are the same, the bit string output by the comparator 410 may be "0001".

The TCAM 120 may perform masking on a result of comparing between the input key and the key stored in the key-value table 400 through a masking unit 420. The masking unit 420 may include a plurality of AND gates. The bits output from the comparator 410 and the mask bits received from the mask generation circuit (e.g., the mask generation circuit 200 of FIG. 2) may be respectively compared through the plurality of AND gates. For example, when the mask bits are "1111" with respect to the bit string "0001" (that is, a mismatch in the LSB) output from the comparator 410, an output of an AND gate outputting the LSB may be "1". Accordingly, data corresponding to "1111" may not be output, and the TCAM 120 may perform an operation of comparing the input key with another key stored in the key-value table 400. As another example, when the mask bits are "1110" with respect to the bit string "0001" output from the comparator 410, outputs of all AND gates of the masking unit 420 may be "0". Accordingly, data corresponding to a key of "1111" stored in the key-value table 400 may be output.

According to the above-described embodiments, it may be seen that when approximation computing is not performed (i.e., the mask bits are "1111"), because it is determined that the input key is not stored in the key-value table 400, no data is output, whereas, when approximation computing is performed (i.e., at least one of bit strings of the mask bits includes 0), data corresponding to the key of the bit string "1111" substantially different from the bit string "1110" of the input key is output.

Referring to FIG. 4B, the TCAM 120 may operate the comparator 410 and the masking unit 420 in parallel. For example, the TCAM 120 may compare and mask the key "1110" input at the same time and a plurality of keys stored in the key-value table 400, for example, 16 keys of "0000" to "1111". According to various example embodiments, in a first layer 430, the TCAM 120 may compare the input key to the key having the "1011" bit string among the keys stored in the key-value table 400, in a second layer 440, the TCAM 120 may compare the input key with the key having the "1111" bit string among the keys stored in the key-value table 400, and further, in a third layer 450, the TCAM 120 may compare the input key with the key having the "1001" bit string among the keys stored in the key-value table 400. The detailed operation of comparing the input key with the key stored in the key-value table 400 is redundant with that of FIG. 4A and thus it is omitted.

FIGS. 5A to 5C illustrate examples of approximation computing for linear and nonlinear functions according to example embodiments of the inventive concepts.

With regard to FIGS. 5A to 5C, FIGS. 5A and 5B illustrate approximation computing using a masking bit when performing ADD and MULTIPLY calculations, which are linear functions, and FIG. 5C illustrates approximation computing using a masking bit when performing the SIGMOID calculation, which is a nonlinear function.

According to various example embodiments, FIG. 5A illustrates a case of performing an a*b+c calculation. The a, b, and c may constitute input keys. That is, the bit string length of each of the input keys may be 16. The TCAM 120 may mask an input key c for the ADD calculation. Although the TCAM 120 performs approximation computing on the ADD calculation, since the influence on a resultant value is relatively smaller than the MULTIPLY calculation, the TCAM 120 may perform masking on the input key c. The TCAM 120 may perform masking in a process of comparing the input key c and a plurality of keys stored in the key-value table 400 to output data corresponding to the input key c.

According to various example embodiments, the TCAM 120 may change an accuracy information value. That is, the TCAM 120 may be controlled to set accuracy information to 1HD to output data with respect to the input key c even if one bit mismatches between the bit string with respect to the input key c and the bit string of the keys stored in the key-value table 400 and to perform the a*b+c calculation. Also, the TCAM 120 may be controlled to set accuracy information to 2HD to output data with respect to the input key c even if two bits are mismatched between the bit string with respect to the input key c and the bit string of the keys stored in the key-value table 400 and to perform the a*b+c calculation.

According to various example embodiments, a range of bits where the mismatch occurs when accuracy corresponds to 1HD and when accuracy corresponds to 2HD may be different. For example, when the accuracy corresponds to 1HD, a position of a bit where one mismatch occurs may be limited to positions of 8 lower bits of a 16-length bit string. As another example, if the accuracy corresponds to 2HD, a position of a bit where two mismatches occur may be limited to positions of 4 lower bits of the 16-length bit string. When the mismatch of one bit is allowed, even if the mismatch occurs in any one of the 8 lower bits, the mismatch may be included in an acceptable error range, but when the mismatch of two bits is allowed and is allowed to occur in two of the 8 lower bits, it may result in a change in the input value beyond the acceptable error range. Therefore, as the approximation degree increases in the approximation computing, the range of bits allowable to cause the mismatch to occur in the bit strings is inevitably narrowed.

According to various example embodiments, referring to FIG. 5A, since the ADD calculation is performed after the a*b calculation, approximation computing may be performed on the data corresponding to the input key c. Here, since the calculation function is ADD, the bit selection information may be the LSB, that is, "0". As described above, when the accuracy corresponds to 1HD, even if a mismatch between bits occurs in any one of the 8 lower bits in the 16-length bit string, the 16-length bit string may be output as the data with respect to the input key c. When the accuracy corresponds to 2HD, even if the mismatch between bits occurs in two of the 4 lower bits in the 16-length bit string, the 16-length bit string may be output as the data with respect to the input key c.

According to various example embodiments, FIG. 5B illustrates a case of performing an a+b calculation. The variables a and b may constitute input keys. That is, the bit string length of each of the input keys may be 16. Since the TCAM 120 is the ADD calculation, the bit selection information may be set to "0". However, FIG. 5B is different from FIG. 5A in that masking may be performed on both an input key a and an input key b. FIG. 5A relates to an operation of summing the data corresponding to the input key c and a resultant value of the MULTIPLY calculation, and thus masking may be performed only in a process of outputting the data with respect to the input key c. Meanwhile, since the input key a and the input key b of FIG. 5B are values stored in the key-value table 400, masking may be performed on both the input key a and the input key b. The same description as that in FIG. 5A may be omitted.

According to various example embodiments, FIG. 5C illustrates performing masking when performing the SIGMOID calculation. The variable a may correspond to an input key. The bit string length of the input key a may be 16. The TCAM 120 may perform masking for outputting data corresponding to the input key a, which is an input value of the SIGMOID calculation. Although the TCAM 120 performs approximation computing on the input value of the SIGMOID calculation and performs masking on an upper bit even if the 16-length bit string is output as the data corresponding to the input key a, the magnitude by which a resultant value changes may be included in the allowable error range. This is because when the input magnitude is more than a certain value due to the characteristics of the SIGMOID function, the output magnitude saturates and has little change. It is described in table (a) that the accuracy may be set to either 1HD or 2HD, and thus it is omitted. However, since a computational function is the SIGMOID calculation, it may be different in that the bit selection information is "1", that is, the MSB. For example, in order to perform approximation computing with the accuracy of 1HD, even if a mismatch occurs in one of 8 upper bits in the 16-length bit string, the 16-length bit string may be output as the data with respect to the input key a. As another example, in order to perform approximation computing with the accuracy of 2HD, even if the mismatch between two bits occurs in 4 upper bits in the 16-length bit string, the 16-length bit string may be output as the data with respect to the input key a. The same descriptions as those provided with reference to FIGS. 5A and 5B are omitted.

Figure 6:
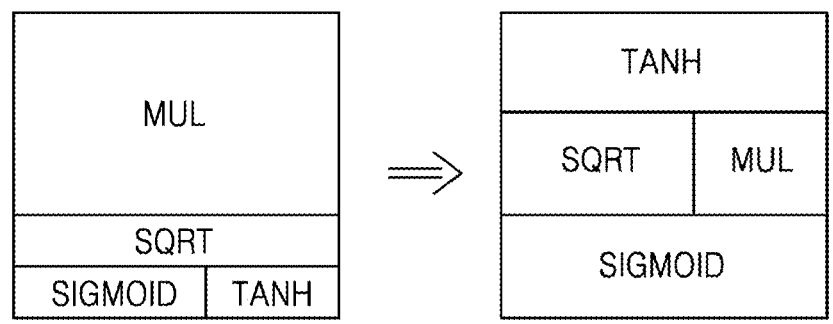
FIG. 6 illustrates an example of a look-up table (LUT) according to an example embodiment of the inventive concepts.

FIG. 6 illustrates an example of the LUT 121 according to an example embodiment of the inventive concepts.

Referring to FIG. 6, the LUT 121 may store calculation resultant values with respect to a plurality of functions. The plurality of functions may include at least the multiply (MUL) calculation, the square root (SQRT) calculation, the SIGMOID calculation, and the hyperbolic tangent (TANH) calculation. A region corresponding to each of the plurality of functions in the LUT 121 may correspond to a region storing function calculation values. For example, a region corresponding to the MUL calculation may correspond to a region storing resultant values of the MUL calculation with respect to a plurality of input values. Referring to FIGS. 5A and 6, the TCAM 120 may obtain data corresponding to the input key a and data corresponding to the input key b in order to perform the a*b calculation. The TCAM 120 may not perform a multiplication calculation between the data corresponding to the input key a and the data corresponding to the input key b and may retrieve a result of performing the multiplication calculation of the data corresponding to the input key a and the data corresponding to the input key b in the region corresponding to the MUL calculation in the LUT 121. According to various example embodiments, when performing the multiplication calculation using a dedicated accelerator for the MULTIPLY calculation, a time of at least 3 clocks and up to 100 clocks may be required, whereas a resultant value of the multiplication calculation may be obtained with only a time required for one clock by using the LUT 121 storing the calculation values with respect to the plurality of functions.

According to various example embodiments, the TCAM 120 may adjust types of functions included in the LUT 121 and the magnitude of a stored resultant value based on an algorithm being executed or instructions. Referring to FIG. 6, a LUT on the left may be a LUT corresponding to a first algorithm, and a LUT on the right may be an LUT corresponding to a second algorithm. That is, in order to perform the first algorithm, when the MUL calculation is most frequently used, the TCAM 120 may allocate a large amount of storage space to the MUL calculation and store the resultant values of the multiplication calculation with respect to the plurality of input values as much as possible. Then, when the second algorithm frequently uses the TANH calculation or the SIGMIOD calculation, the TCAM 120 may change a configuration of a storage region to store resultant values of the TANH calculation or the SIGMOID calculation. That is, although a large number of resultant values with respect to the MUL calculation are required through the first algorithm, when the storage region of the LUT 121 is set to correspond to the second algorithm, since a necessary calculation result value may not be stored in the LUT 121, a dedicated accelerator or the subprocessor 130 may be used to directly perform calculations, and the time required for performing calculation increases, which may cause the overall performance degradation. Accordingly, the TCAM 120 may fluidly change the storage region of the LUT 121 based on an algorithm or instructions to be performed, thereby realizing a high calculation processing speed by reading the resultant value without directly performing calculations.

Figure 7:
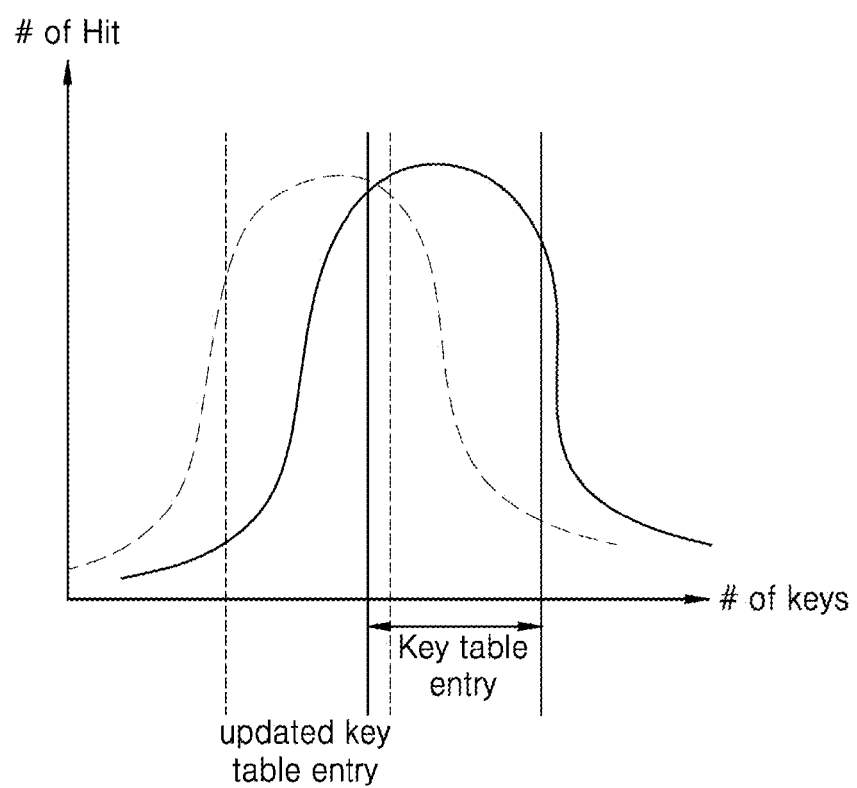
FIG. 7 illustrates an example of a normal distribution graph of input keys stored in a key-value table and the number of hits according to example embodiments of the inventive concepts.

FIG. 7 illustrates an example of a normal distribution graph of input keys stored in the key-value table 400 and the number of hits according to example embodiments of the inventive concepts.

Referring to FIG. 7, the graph shows a distribution of the number of hits according to a distribution of the input keys. The number of hits with respect to all the input keys may follow a normal distribution. That is, an input key frequently called among all the input keys may have a large number of hits, and an input key that is rarely called may have a small number of hits. An input key distribution before updating the input keys of the key-value table 400 may correspond to a "key table entry". That is, the key-value table 400 may store only input keys in a range exceeding a predetermined number of hits without storing all values with respect to all the input keys. As described above, this is because it is necessary to perform an operation of comparing a searched key to an input key simultaneously through a plurality of layers (e.g., 430, 440, and 450 of FIG. 4B). However, when the TCAM 120 identifies that an input key corresponding to the searched key is not stored in the key-value table 400 through the hit/miss counter 125, the TCAM 120 may transmit an update request signal UPDATE REQ to the scheduler 127. The scheduler 127 may receive the update request signal and request the random access memory 140 for an input key that is not stored in the key-value table 400 and a value corresponding thereto. The random access memory 140 may transmit the input key that is not stored in the key-value table 400 and the value corresponding thereto to the key-value table 400 or the LUT 121 including the key-value table 400 as update information UPDATE INFORMATION. The key-value table 400 or the LUT 121 including the key-value table 400 may change the stored input keys based on the update information UPDATE INFORMATION.

According to various example embodiments, the graph illustrated in a dashed line in FIG. 7 may refer to the input key distribution after changing the input keys stored in the key-value table 400 according to the update information. That is, when a miss occurs because the searched key mismatches the input keys stored in the key-value table 400, a possibility of occurrence of the miss in the future may be reduced by changing a range of the input keys of the key-value table 400.

Figure 8:
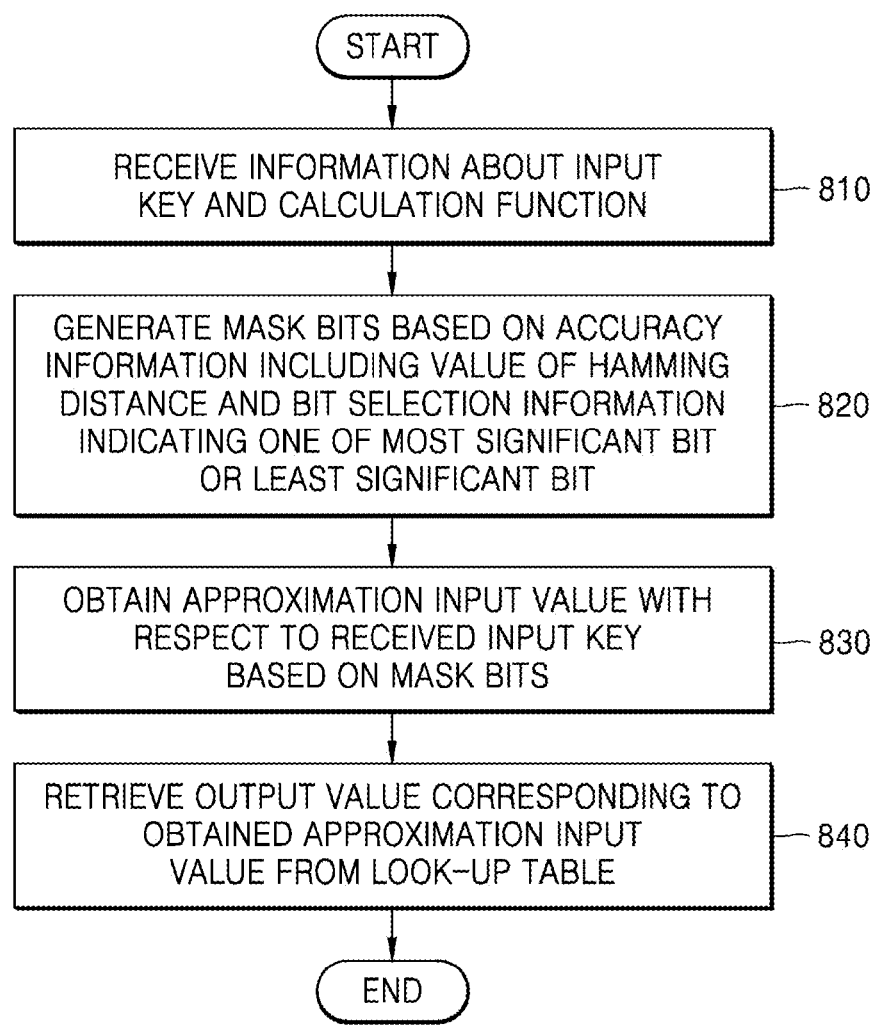
FIG. 8 illustrates an operation order of a TCAM according to example embodiments of the inventive concepts.

FIG. 8 illustrates an operation order of the TCAM 120 according to example embodiments of the inventive concepts.

Referring to FIG. 8, in operation 810, the TCAM 120 may receive information about an input key and a calculation function. The TCAM 120 may generate bit selection information based on the received information about the calculation function. The bit selection information may be information indicating one of the LSB or the MSB based on the characteristic of the calculation function. For example, because the SIGMIOD function has the characteristic that an output value saturates as an input value increases, the TCAM 120 may generate the bit selection information indicating the MSB.

In operation 820, the TCAM 120 may generate mask bits based on accuracy information and the bit selection information. The accuracy information may correspond to information that mismatches the received input key but is determined as an approximation input key for approximation computing. For example, when the accuracy information is 1HD, keys different from the input key by 1 bit may be determined as the approximation input key. As another example, when the accuracy information is 2HD, one of keys different from the input key by two bits may be determined as the approximation input key. The TCAM 120 may determine a position of a bit in which a mismatch is allowed based on the bit selection information. For example, when the bit selection information indicates the MSB and the accuracy information is 2HD, the TCAM 120 may determine a key that mismatches the received input key by two bits within a certain range of bits from the MSB as the approximation input key.

In operation 830, the TCAM 120 may obtain an approximation input value with respect to the received input key using the mask bits. The TCAM 120 may compare the received input key with each of the keys stored in the key-value table 400 and when bit positions of different values are the same as a position of "0" among the mask bits, the TCAM 120 may output a value corresponding to the compared key. For example, when the received input key is "1001" and compared with "1011" stored in the key-value table 400, a bit having different values may correspond to a lower second bit. In this case, when a value of the lower second bit among the mask bits is "0", "1001" and "1011" are substantially different, but are determined as the approximation input key, and a value corresponding to "1011" in the key-value table 400 may be output as an approximation input value. That is, the TCAM 120 may perform approximation computing on the received input key using the mask bits, thereby reducing the number of misses with respect to the received input key.

In operation 840, the TCAM 120 may search the LUT 121 for an output value corresponding to the obtained approximation input value. That is, the TCAM 120 may perform a calculation function using the obtained approximation input value as an input and output a resultant value. However, the TCAM 120 may search for and output a corresponding resultant value when the obtained approximation input value is an input among calculation resultant values stored in the LUT 121 without directly performing calculations. For example, when performing the SIGMOID calculation with the obtained approximation input value, the TCAM 120 may retrieve a resultant value of performing the SIGMOID calculation on the obtained approximation input value in a storage space corresponding to the SIGMOID function and output the retrieved value.

FIGS. 9A to 9E illustrate usage scenarios of the TCAM 120 according to example embodiments of the inventive concepts.

Referring to FIGS. 9A to 9E, various example embodiments of an electronic device including the TCAM 120 are shown.

Figure 9A:
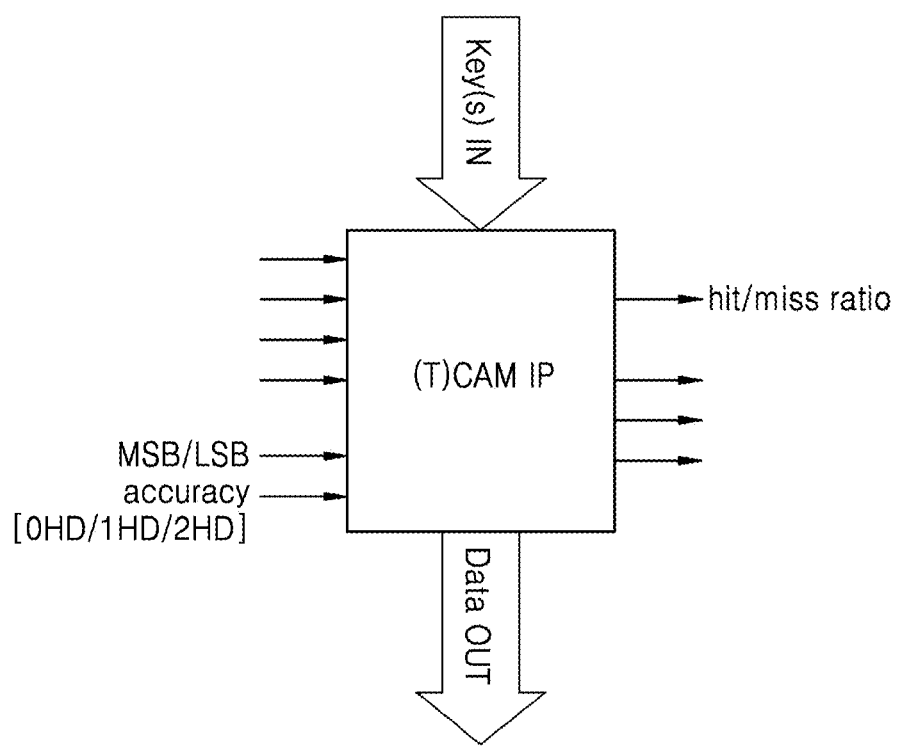
FIGS. 9A to 9E illustrate usage scenarios of a TCAM according to example embodiments of the inventive concepts.

Referring to FIG. 9A, the electronic device may include a processor and a single TCAM. That is, when the processor transmits a calculation and an input key necessary for performing an ML and/or DL algorithm to the TCAM 120, the TCAM may perform a masking operation on the input key to select data corresponding to one key having an approximate value to an input key received from the processor among input keys stored in the TCAM. Thereafter, the TCAM may obtain a value corresponding to the selected data among resultant values previously calculated with reference to an LUT and output the value as a calculation result. According to an example embodiment, the TCAM may receive bit selection information (MSB/LSB) and accuracy information (0HD/1HD/2HD) from the processor to generate mask bits. The TCAM may perform approximation computing on the input key based on the mask bits and output information about a ratio of hits or misses with respect to the approximated input key.

Figure 9B:
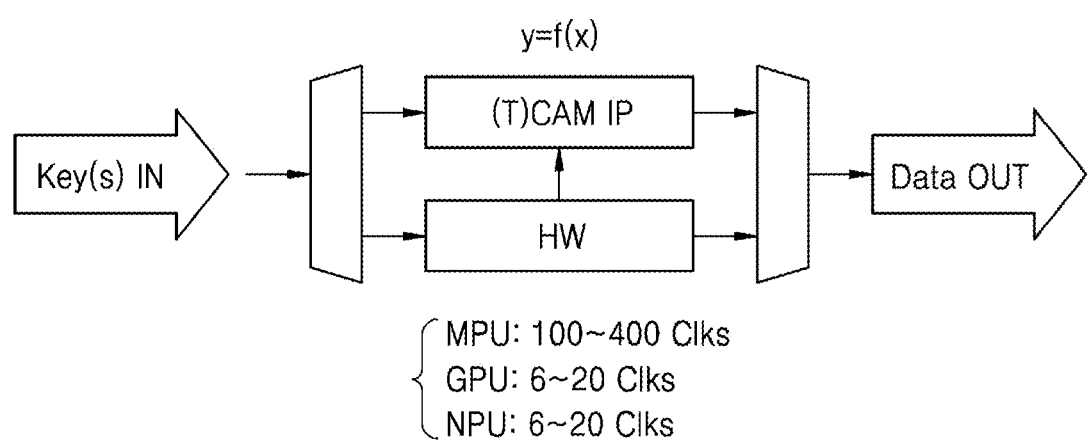

Referring to FIG. 9B, the electronic device may further include hardware HW. The hardware HW may correspond to any one of a graphics processing unit (GPU), a neural processing unit (NPU), and a micro processing unit (MPU). As shown in FIG. 9B, when the hardware HW is the NPU or the GPU, a calculation speed may be performed within 6 to 20 clocks, and when the hardware HW is a micro processing unit (MPU), the calculation speed may be within 100 clocks to 400 clocks. Thus, the electronic device may cause the hardware HW to perform the calculation without causing the main processor to perform the calculation. According to various example embodiments, the hardware HW may previously perform computing on a calculation result that is not stored in the LUT of the TCAM. Thereafter, the hardware HW may transmit computing data with respect to the calculation result to the TCAM in response to receiving an update request from a scheduler of the TCAM.

Figure 9C:
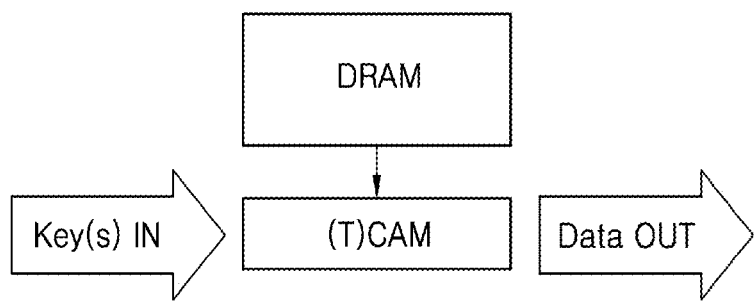

Referring to FIG. 9C, the electronic device may further include dynamic random access memory (DRAM) to store calculation results with respect to input keys having a low number of calls in a distribution of input keys. That is, a calculation on a plurality of keys that may be input to the electronic device and a plurality of functions respectively with respect to the plurality of keys may be previously performed, and all calculation resultant values may be stored in the DRAM. In this case, when the hit/miss ratio of the input key changes, the TCAM may request an update for updating the calculation resultant values of the LUT by reflecting this change.

Figure 9D:
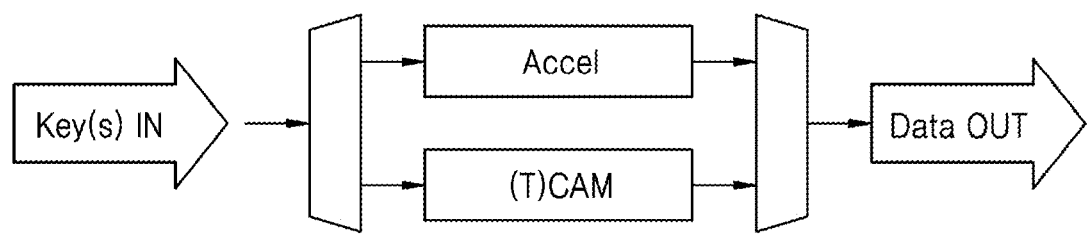

Referring to FIG. 9D, the electronic device may further include an accelerator disposed in parallel. That is, when the resultant value of a function calculation on the input key is stored in the LUT, the TCAM may read the LUT to output data quickly, and a request that is not the function calculation stored in the LUT may be performed through the accelerator disposed in parallel.

Figure 9E:
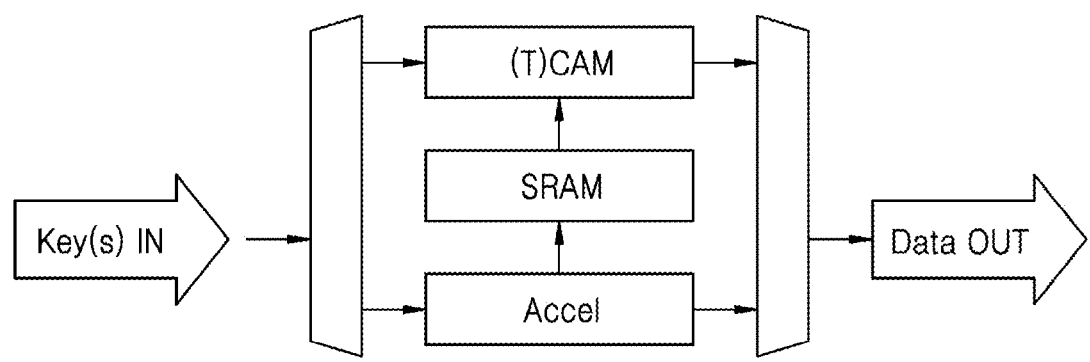

Referring to FIG. 9E, the electronic device may include a TCAM, random access memory (RAM), and an accelerator. Where an input key stored in the LUT and a resultant value of a function calculation on the input key are present, the TCAM may read the LUT to quickly output data. A request that is not the function calculation stored in the LUT may be performed through the accelerator disposed in parallel. A function calculation that is not stored in the LUT may be performed through the accelerator, and a resultant value of the performed function calculation may be output as data and simultaneously transmitted to the RAM disposed in parallel. Therefore, when a request for the same function calculation is received later, the RAM may pre-load the resultant value of the function operation previously performed through the accelerator into the LUT, thereby improving a calculation speed.

Figure 10:
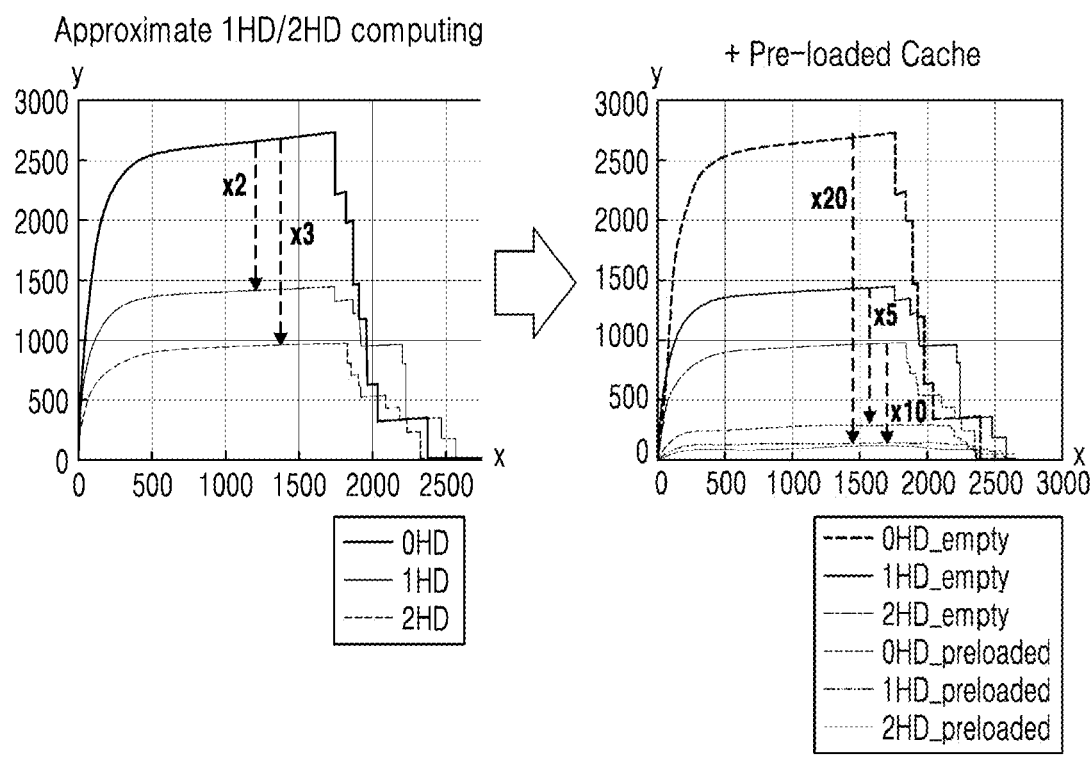
FIG. 10 illustrates a graph showing a reduction in an accumulated miss ratio according to example embodiments of the inventive concepts.

FIG. 10 illustrates a graph showing a reduction in an accumulated miss ratio according to example embodiments of the inventive concepts.

Referring to FIG. 10, a left graph shows an accumulated value of the number of misses that occurred when approximation computing is performed on an input key, and a right graph shows an accumulated value of the number of misses that occurred when pre-load data is stored in an LUT in addition to the approximation computing on the input key.

Referring to the left graph, it may be seen that a key that is not the same as the input key but has an approximate value is used as the data, a value by which the number of misses that occurred saturates is reduced by 2 times the accuracy of 1HD and 3 times the accuracy of 2HD. In addition, referring to the right graph, it may be seen that as a result of storing a calculation resultant value corresponding to an input key that is highly likely to be called in the LUT as well as approximation computing on the input key, even if the input key is approximated, since the key is not stored in the LUT, separate hardware performs calculations or the number of update requests from external RAM is reduced, and thus a value by which the number of misses that occurred saturates is reduced by 5 times when data is pre-loaded with accuracy of 1HD and 10 times when data is pre-loaded with accuracy of 2HD.

The elements of FIGS. 1 through 10 described above, such as the TCAM 120 and sub processors 130 including the TCAM controller 123, hit/miss counter 125, scheduler 127, and approximation unit 129, as well as the main processor 110 may be implemented in processing circuitry such as hardware including logic circuits; a hardware/software combination such as a processor executing software; or a combination thereof and memory. For example, the processing circuitry more specifically may include, but is not limited to, a central processing unit (CPU), an arithmetic logic unit (ALU), a digital signal processor, a microcomputer, a field programmable gate array (FPGA), a programmable logic unit, a microprocessor, application-specific integrated circuit (ASIC), etc., and the memory 140 may include various volatile or non-volatile memory devices configured to store information, such as the LUT 121.

The processing circuitry may be special purpose processing circuitry that improves processing performance by increasing the calculation speed by performing approximation computing using mask bits with respect to preloaded data thus increasing a hit ratio and reducing an operation compared to when a calculation is performed through the dedicated accelerator for each calculation.

While the inventive concepts have been particularly shown and described with reference to some example embodiments thereof, it will be understood that various changes in form and details may be made therein without departing from the spirit and scope of the following claims.

What is claimed is:

1. A ternary content addressable memory device (TCAM) comprising:
   a cache memory configured to store a look-up table for a plurality of functions; and
   processing circuitry configured to,
      generate mask bits,
      obtain an approximation input value corresponding to an input key based on the mask bits, and
      retrieve an output value corresponding to the approximation input value from the look-up table
      wherein the processing circuitry is configured to determine the mask bits based on accuracy information and bit selection information, the accuracy information including a value of a hamming distance and the bit selection information indicating one of a most significant bit (MSB) or a least significant bit (LSB).

2. The TCAM of claim 1, wherein the processing circuitry is configured to determine the bit selection information based on a type of one of the plurality of functions for which the approximation input value is calculated.

3. The TCAM of claim 1, wherein the processing circuitry is configured to update the mask bits every at least one clock.

4. The TCAM of claim 1, wherein a number of mask bits is same as a number of bits of the input key.

5. The TCAM of claim 1, wherein the processing circuitry is further configured to,
   receive information indicating one of a hit or a miss with respect to the approximation input value such that the information indicates the hit in response to obtaining the approximation input value approximate to the input key using the mask bits, and the information indicates the miss in response to not obtaining the approximation input value approximate to the input key using the mask bits, and
   update a number of hits or a number of misses according to the information.

6. The TCAM of claim 5, wherein the processing circuitry is further configured to update the look-up table in response to an update request.

7. The TCAM of claim 6, wherein, when the number of misses with respect to the input key exceeds a threshold, the processing circuitry is configured to update the look-up table based on data stored in a random access memory or a flash memory positioned outside of the TCAM or a calculation result from a processor positioned outside of the TCAM.

8. The TCAM of claim 7, wherein the processor is implemented as one of a micro processing unit (MPU), a neural processing unit (NPU), and a graphics processing unit (GPU).

9. The TCAM of claim 1, wherein the look-up table stores calculation resultant values corresponding to input keys of which a hit ratio exceeds a threshold ratio.

10. A method of operating a ternary content addressable memory device (TCAM), the method comprising:
    receiving information about an input key and a calculation function;
    generating mask bits based on accuracy information and bit selection information, the accuracy information including a value of a hamming distance and the bit selection information indicating one of a most significant bit (MSB) or a least significant bit (LSB);
    obtaining an approximation input value corresponding to the input key based on the mask bits; and
    retrieving an output value corresponding to the approximation input value from a look-up table.

11. The method of claim 10, further comprising:
    determining the bit selection information based on a type of the calculation function.

12. The method of claim 10, further comprising:
    updating the mask bits every at least one clock.

13. The method of claim 10, wherein a number of mask bits is same as a number of bits of the input key.

14. The method of claim 10, further comprising:
receiving information indicating one of a hit or a miss with respect to the approximation input value such that the information indicates the hit in response to obtaining the approximation input value approximate to the input key using the mask bits, and the information indicates the miss in response to not obtaining the approximation input value approximate to the input key using the mask bits; and
updating a number of hits or a number of misses according to the information.

15. The method of claim 10, further comprising:
updating the look-up table in response to an update request.

16. The method of claim 15, further comprising:
requesting data for updating the look-up table from a random access memory or a flash memory positioned outside of the TCAM, or requesting a calculation from a processor positioned outside of the TCAM, when a number of misses with respect to the input key exceeds a threshold.

17. The method of claim 16, wherein the processor is implemented as one of a micro processing unit (MPU), a neural processing unit (NPU), and a graphics processing unit (GPU).

18. The method of claim 10, wherein the look-up table stores calculation resultant values corresponding to input keys of which a hit ratio exceeds a threshold ratio.

19. A ternary content addressable memory device (TCAM) comprising:
processing circuitry configured to generate mask bits for approximation computing; and
a look-up table configured to store calculation results with respect to a plurality of functions, wherein
the approximation computing includes obtaining an approximation input value corresponding to an input key based on the mask bits, and retrieving an output value corresponding to the approximation input value from the look-up table
wherein the processing circuitry is configured to determine the mask bits based on accuracy information and bit selection information, the accuracy information including a value of a hamming distance and the bit selection information indicating one of a most significant bit (MSB) or a least significant bit (LSB).

* * * * *